(12) United States Patent
Chen et al.

(10) Patent No.: US 12,640,721 B2
(45) Date of Patent: May 26, 2026

(54) GATE CLAMPING CIRCUIT FOR DRIVING WIDE BANDGAP POWER DEVICE

(71) Applicant: The Hong Kong University of Science and Technology, Hong Kong (CN)

(72) Inventors: Jing Chen, Hong Kong (CN); Ji Shu, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 236 days.

(21) Appl. No.: 18/605,836

(22) Filed: Mar. 15, 2024

(65) Prior Publication Data

US 2024/0313758 A1     Sep. 19, 2024

Related U.S. Application Data

(60) Provisional application No. 63/490,779, filed on Mar. 17, 2023.

(51) Int. Cl.
H03K 17/081          (2006.01)
(52) U.S. Cl.
CPC ................................. H03K 17/081 (2013.01)
(58) Field of Classification Search
CPC .. H03K 17/081; H03K 17/08122; H02M 1/08
(Continued)

(56) References Cited

U.S. PATENT DOCUMENTS 9,935,625 B2     4/2018   Yamaguchi
10,979,032 B1 *  4/2021   Leong .................... H03K 17/56
(Continued)

FOREIGN PATENT DOCUMENTS

CN          103944549 A  *  7/2014  ........... H03K 17/163
CN          108683327 A  *  10/2018  .............. H02M 1/08
(Continued)

OTHER PUBLICATIONS

Zheyu Zhang et al., "Evaluation of Switching Loss Contributed by Parasitic Ringing for Fast Switching Wide Band-Gap Devices," IEEE Transactions on Power Electronics, 2019, vol. 34 (9), p. 9082-9094.

(Continued)

*Primary Examiner* — Sreeya Sreevatsa
(74) *Attorney, Agent, or Firm* — IDEA Intellectual Limited; Sam T. Yip

(57)                ABSTRACT

A gate clamping circuit for driving a wide bandgap (WBG) device is provided. The gate clamping circuit comprises: a semiconductor switching device having a high side terminal connected to a gate of the WBG device; and a low side terminal connected to a source of the WBG device; a clamping resistor having a first end connected to a negative power supply terminal of a driver chip; and a second end connected to a control terminal of the semiconductor switching device; and a clamping capacitor having a first end connected to the second end of the clamping resistor; and a second end connected to the low side terminal of the semiconductor switching device; wherein the gate clamping circuit is configured to clamp negative voltage spike generated at the gate of the WBG device to suppress overstress of the gate of the WBG device when a negative off-state gate voltage is applied.

14 Claims, 8 Drawing Sheets

100

101          102

(58) Field of Classification Search
USPC .......................................................... 361/56
See application file for complete search history.

(56) References Cited

U.S. PATENT DOCUMENTS

2019/0393693 A1    12/2019   Shibib et al.
2020/0161466 A1    5/2020    Yen et al.

FOREIGN PATENT DOCUMENTS

CN          111404411 A   *   7/2020    ........ H02M 7/53803
CN          114978133 A   *   8/2022    ............. H03K 17/08

OTHER PUBLICATIONS

Md Rishad Ahmed et al., "Predicting SiC MOSFET Behavior Under Hard-Switching, Soft-Switching, and False Turn-On Conditions," IEEE Transactions on Industrial Electronics, 2017, vol. 64 (11), p. 9001-9011.

Zheyu Zhang et al., "Intelligent Gate Drive for Fast Switching and Cross-Talk Suppression of SiC Devices," IEEE Transactions on Power Electronics, 2017, vol. 32 (12), p. 9319-9332.

Chengmin Li et al., "High Off-State Impedance Gate Driver of SiC MOSFETs for Crosstalk Voltage Elimination Considering Common-Source Inductance," IEEE Transactions on Power Electronics, 2020, vol. 35 (3), p. 2999-3011.

Ho-Tin Tang et al., "Passive Resonant Level Shifter for Suppression of Crosstalk Effect and Reduction of Body Diode Loss of SiC MOSFETs in Bridge Legs," IEEE Transactions on Power Electronics, 2020, vol. 35 (7), p. 7204-7225.

Mustafa Tahir et al., "Performance Improvement Strategies for Discrete Wide Bandgap Devices: A Systematic Review," frontiers in Energy Research, 2021, vol. 9 (788689), p. 1-22.

Daniel Martin et al., "Performance Analysis of a SiC MOSFET Half Bridge Power Module with a Miller Clamp," 2017 IEEE International Workshop on Integrated Power Packaging, 2017, p. 1-5.

Zheyu Zhang et al., "Active Gate Driver for Crosstalk Suppression of SiC Devices in a Phase-Leg Configuration," IEEE Transactions on Power Electronics, 2014, vol. 29 (4), p. 1986-1997.

"SiC Power Devices and Modules Application Note Rev.003," ROHM Semiconductor—ROHM Co., Ltd., Nov. 2020, No. 63AN102E, p. 1-88.

Ziyue Dang et al., "A New GaN Hybrid Resonant-Clamping Gate driver For High Frequency SiC MOSFETs," EPE'20 ECCE Europe, 2020, p. 1-6.

Ji Shu et al., "Protection of SiC MOSFET from Negative Gate Voltage Spikes with a Low-Voltage GaN HEMT," 2023 35th International Symposium on Power Semiconductor Devices and ICs, 2023, p. 1-4.

Ji Shu et al., "A Gate Driver with a Low-Voltage GaN HEMT for False Turn-on Suppression and Gate Reliability Enhancement of SiC MOSFETs," 2024 IEEE Applied Power Electronics Conference and Exposition, 2024, p. 1-5.

* cited by examiner

100

101

102

GATE CLAMPING CIRCUIT FOR DRIVING WIDE BANDGAP POWER DEVICE

CROSS-REFERENCE TO RELATED APPLICATIONS

The present application claims priority from the U.S. Provisional Patent Application No. 63/490,779 filed Mar. 17, 2023. The disclosure of which is incorporated herein by reference in its entirety.

COPYRIGHT NOTICE

FIELD OF THE INVENTION

The present invention generally relates to voltage clamping technology. More specifically the present invention relates to a gate clamping circuit for clamping negative spikes to suppress voltage overstress of a gate of a wide bandgap device when a negative OFF-state gate voltage is applied to the gate of the wide bandgap device.

BACKGROUND OF THE INVENTION

Wide bandgap (WBG) power devices, such as Silicon Carbide (SiC) power metal-oxide-semiconductor field-effect transistors (MOSFETs) and gallium nitride (GaN) high-electron-mobility transistors (GaN HEMTs), can be operated at higher frequencies and higher temperatures than the traditional Si-based power devices of similar voltage and current ratings, thereby becoming the devices of choice in many high-efficiency and high-power-density converters. To operate the WBG power devices at high speeds appropriately, however, the parasitic inductances, especially those in the gate loop, need to be carefully managed.

First, the parasitic inductance impedes the gate current during the switching transient, thereby slowing down the switching speed and increasing the switching loss. Second, the parasitic inductance in series with the gate capacitance may induce gate-loop oscillation, which could lead to false turn-on during the switching process in view of the relatively low threshold voltages of some commercial WBG power devices. Third, the parasitic inductance could also lead to considerable positive and negative gate voltage spikes on the OFF-state device when adjacent devices are switching (also known as crosstalk). The positive gate voltage spikes could also lead to false turn-on, whereas the negative gate voltage spikes could overstress the gate as the minimum allowed gate voltages of mainstream WBG power devices (especially SiC MOSFETs) are limited, usually in the range of −3 to −10 V.

One solution to suppress the false turn-on is to use a gate driver with a Miller-clamping function to suppress the crosstalk-induced gate spikes. However, Miller clamp cannot address the other two issues caused by the parasitic inductance, i.e., the reduced switching speed and oscillation-induced false turn-on. In addition, the performance of Miller clamp could be compromised by the parasitic inductance during the fast switching transient of WBG power devices.

Another solution is to use a negative OFF-state gate voltage to turn off the device. The negative OFF-state gate voltage creates a wider margin below threshold voltage to accommodate the gate voltage spikes/ringing induced by crosstalk and oscillation, so that the false turn-on can be suppressed. However, from the reliability angle, especially when the negative gate spike induced by the crosstalk is superimposed during the falling edge of the drain-source voltage, the negative OFF-state gate voltage could lead the gate bias getting into the unsafe range, thus causing gate voltage overstress.

SUMMARY OF THE INVENTION

It is one objective of the present invention to provide a gate clamping circuit for driving a wide bandgap device. The gate clamping circuit can clamp negative voltage spikes effectively when the wide bandgap device is at high switching speed, thereby protecting the gate of the wide bandgap device from voltage overstress when a negative OFF-state gate voltage is applied.

In accordance with a first aspect of the present invention, a gate clamping circuit for driving a wide bandgap device is provided. The wide bandgap device may be a SiC MOSFET having a gate, a drain, and a source. The gate clamping circuit comprises: a semiconductor switching device having a high side terminal connected to a gate of the wide bandgap device; and a low side terminal connected to a source of the wide bandgap device; a clamping resistor having a first end connected to the negative power supply terminal of a driver chip; and a second end connected to a control terminal of the semiconductor switching device; and a clamping capacitor having a first end connected to the second end of the clamping resistor; and a second end connected to the low side terminal of the semiconductor switching device; wherein the gate clamping circuit is configured to clamp negative voltage spike generated at the gate of the wide bandgap device to protect the gate of the wide bandgap device from voltage overstress when a negative off-state gate voltage is applied.

According to a second aspect of the present invention, a gate clamping driver circuit for driving a wide bandgap device. The gate clamping driver circuit comprises: a driver chip having at least a driving terminal, a negative power supply terminal, a positive power supply terminal and a ground reference terminal; a driving resistor having a first end connected to the driving terminal of the driver chip, and a second end connected to a gate of the wide bandgap device; and a gate clamping circuit according to the first aspect of the present invention.

In one embodiment of the present invention, the gate clamping circuit includes: a semiconductor switching device having a high side terminal connected to the gate of the wide bandgap device; and a low side terminal connected to the source of the wide bandgap device; a clamping resistor having a first end connected to the negative power supply terminal of the driver chip; and a second end connected to a control terminal of the semiconductor switching device; and a clamping capacitor having a first end connected to the second end of the clamping resistor; and a second end connected to the low side terminal of the semiconductor switching device.

In one embodiment of the present invention, the semiconductor switching device is a high-electron-mobility-transistor (HEMT) having a drain being the high side terminal of the semiconductor switching device; a source being the low side terminal of the semiconductor switching device; and a gate being the control terminal of the semiconductor switching device.

In one embodiment of the present invention, the HEMT is a gallium nitride (GaN) HEMT.

In one embodiment of the present invention, the GaN HEMT is enhancement-mode (E-mode) GaN HEMT.

In one embodiment of the present invention, the E-mode GaN HEMT has a rated voltage higher than the ON-state gate voltage of the wide bandgap device to be driven, e.g., 20 V, In one embodiment of the present invention, the E-mode GaN HEMT has a rated current higher than the current flowing through the gate driver circuit during the crosstalk event, e.g., 0.1 A.

In one embodiment of the present invention, the clamping resistor has a resistance value in a range of 1Ω-10000 Ω, In one embodiment of the present invention, the clamping capacitor has a capacitance value higher than 0.1 nF.

In one embodiment of the present invention, the clamping resistor and the clamping capacitor can be monolithically integrated with the E-mode GaN HEMT.

BRIEF DESCRIPTION OF THE DRAWINGS

Embodiments of the invention are described in more details hereinafter with reference to the drawings, in which:

FIG. 4A shows the current flow and change of $V_{DS}$ when high side switch is turned on. FIG. 4B shows the current flow and change of $V_{DS}$ when high side switch is turned off.

DETAILED DESCRIPTION

In the following description, details of the present invention are set forth as preferred embodiments. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
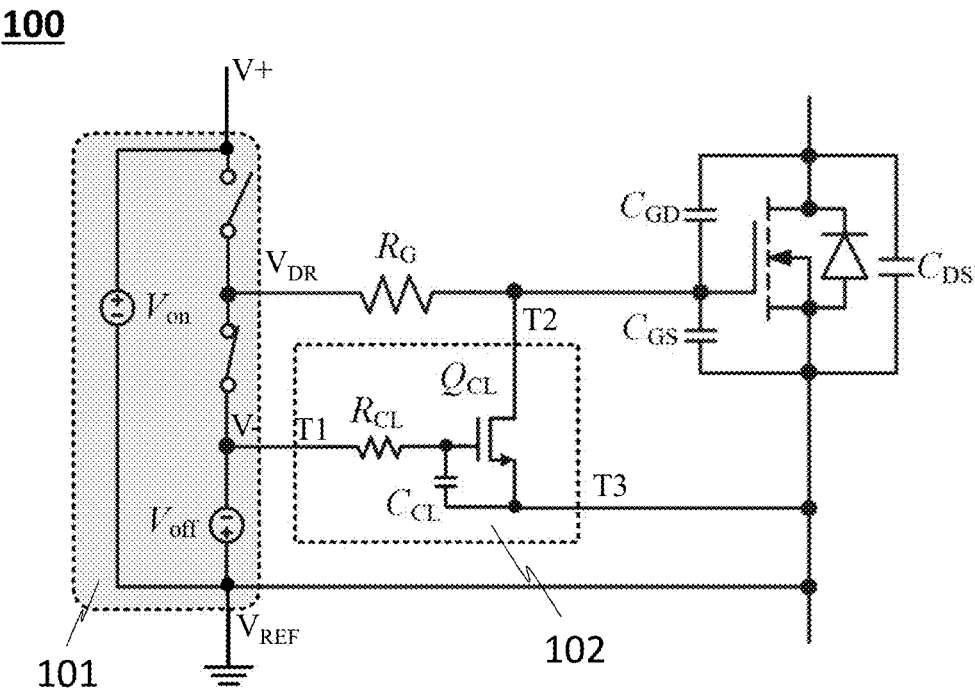
FIG. 1 shows a circuit diagram of a gate clamping driver circuit for driving a MOSFET in accordance with one embodiment of the present invention.

FIG. 1 shows a circuit diagram of a gate clamping driver circuit 100 for driving a MOSFET in accordance with one embodiment of the present invention. The MOSFET may be a SiC MOSFET having a gate, a drain and a source. As shown, the gate clamping driver circuit 100 comprises a driver chip 101; a driving resistor $R_G$; and a gate clamping circuit (GCC) 102.

The driver chip 101 has at least a driving terminal $V_{DR}$, a negative power supply terminal V−, a positive power supply terminal V+ and a reference terminal $V_{REF}$. The driving resistor $R_G$ has a first end connected to the driving terminal of the driver chip, and a second end connected to a gate of the MOSFET. The GCC 102 has a first terminal T1 connected to the negative power supply terminal V− of the driver chip; a second terminal T2 connected to the gate of the MOSFET; and a third terminal T3 connected to the source of the MOSFET.

The GCC 102 is configured to clamp negative voltage spike generated at the gate of the MOSFET to protect the gate of the MOSFET from voltage overstress when a negative off-state gate voltage is applied.

In one embodiment, the GCC 102 includes a semiconductor switching device $Q_{CL}$ having a high side terminal connected to the gate of the MOSFET; and a low side terminal connected to the source of the MOSFET; a clamping resistor $R_{CL}$ having a first end connected to the negative power supply terminal of the driver chip; and a second end connected to a control terminal of the switching device $Q_{CL}$; and a clamping capacitor $C_{CL}$ having a first end connected to the second end of the clamping resistor; and a second end connected to the low side terminal of the switching device $Q_{CL}$.

Preferably, the clamping resistor $R_{CL}$ has a resistance value in a range of 1Ω-10000Ω. The clamping capacitor $C_{CL}$ has a capacitance value higher than 0.1 nF.

Preferably, the semiconductor switching device $Q_{CL}$ is a high-electron-mobility-transistor (HEMT) having a drain being the high side terminal of the semiconductor switching device; a source being the low side terminal of the semiconductor switching device; and a gate being the control terminal of the semiconductor switching device.

Preferably, the HEMT $Q_{CL}$ is an enhancement-mode (E-mode) gallium nitride (GaN) HEMT having a rated voltage higher than the on-state gate voltage of the wide bandgap device, e.g., 20 V; and a rated current higher than the current flowing through the gate circuit, e.g., 0.1 A.

Figure 2A:
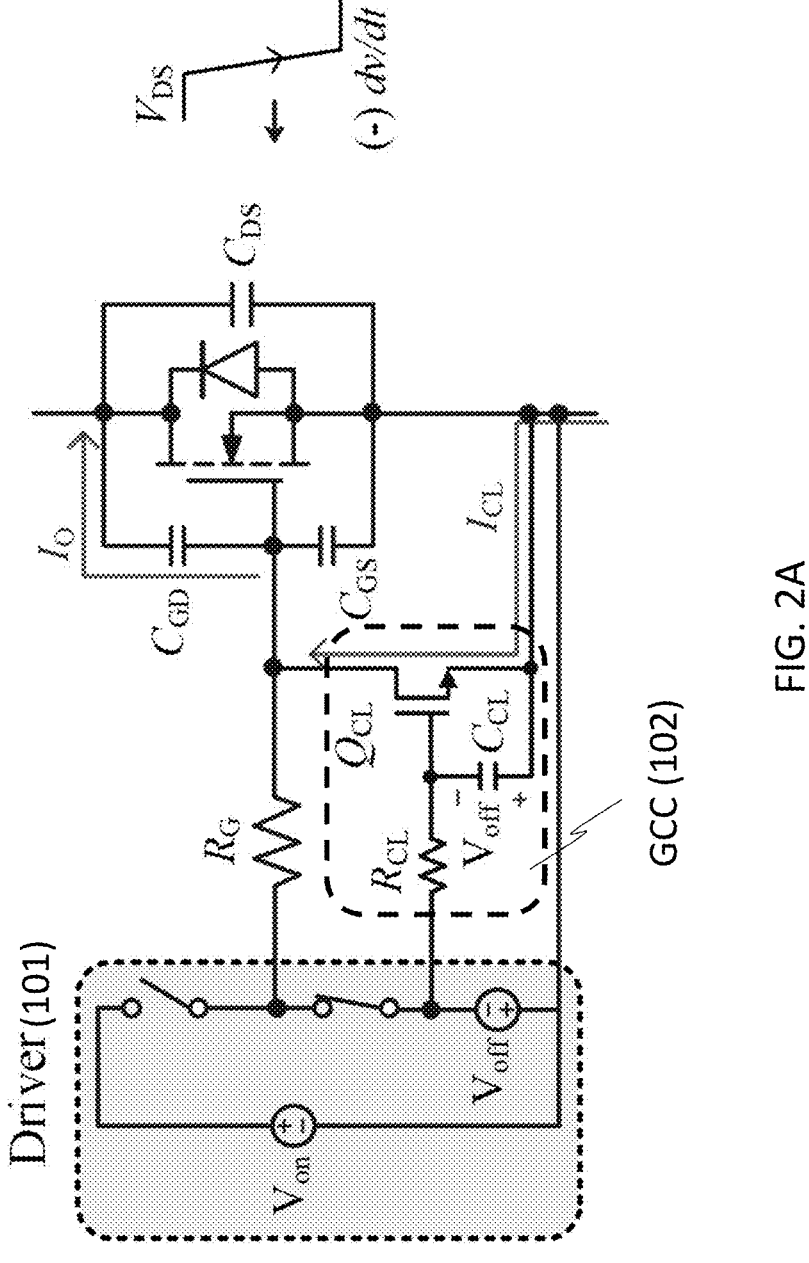
FIGS. 2A and 2B show the operation principle of a gate clamping circuit (GCC) in accordance with one embodiment of the present invention.
Figure 2B:
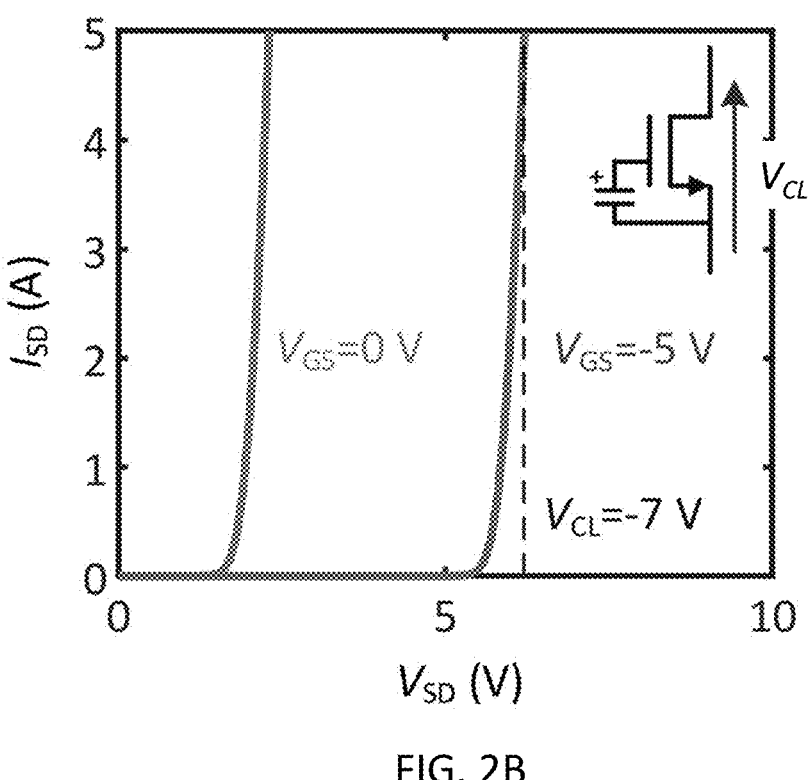

FIGS. 2A and 2B show the operation principle of the GCC, the gate of HEMT is fixed to the negative power rail of the SiC MOSFET driver through a resistor $R_{CL}$ without the need of an additional driver for the GaN HEMT $Q_{CL}$. Preferably, the resistor $R_{CL}$ is applied to prevent possible oscillation on the gate voltage of $Q_{CL}$ during the start-up and switching process. A clamping capacitor $C_{CL}$ is connected across the gate and source of HEMT $Q_{CL}$ to ensure HEMT $Q_{CL}$ is always in OFF state with a stable negative $V_{GS}$, which is equal to the $V_{off}$ of the SiC MOSFET. Preferably, the gate-source capacitor $C_{CL}$ has a capacitance higher than 0.1 nF.

As shown in FIG. 2B, the clamping voltage $V_{CL}$ of the GCC is the reverse conduction turn-on voltage of HEMT. When a negative spike occurs, the HEMT $Q_{CL}$ will be reversely turned-on if the spike voltage amplitude exceeds $V_{CL}$. As a result, as shown in FIG. 2A, most of the crosstalk induced current $I_O$ will be diverted into the HEMT $Q_{CL}$, i.e., the current $I_{CL}$ shown in FIG. 2A. Hence the negative gate voltage spikes of SiC MSOFET can be clamped at the clamping voltage $V_{CL}$.

Figure 3A:
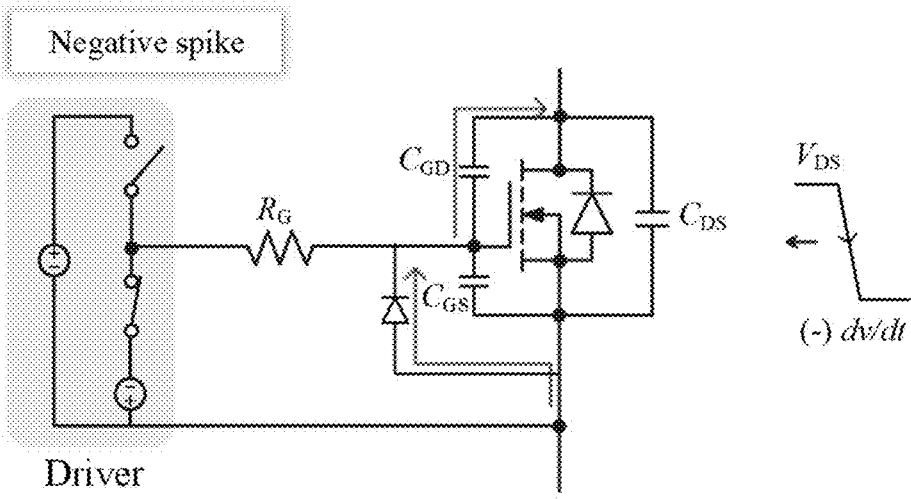
FIGS. 3A and 3B show a simplified working principle and the SiC MOSFET gate voltage waveform with the GCC.
Figure 3B:
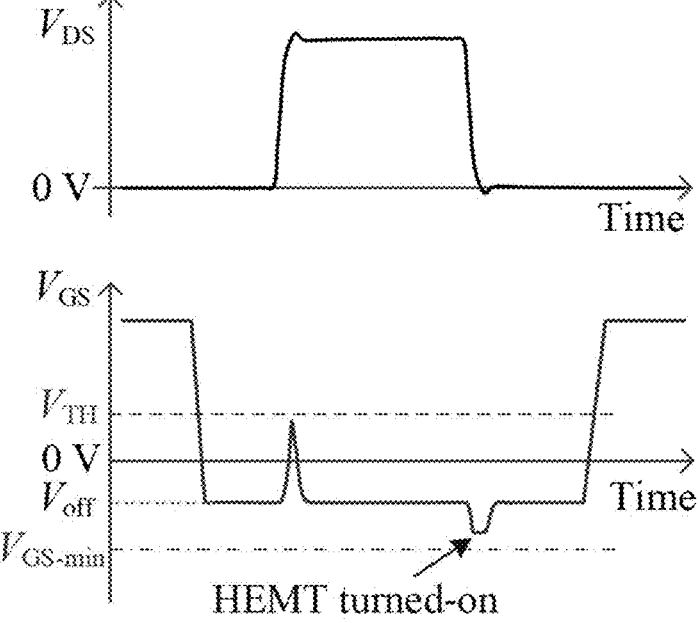

FIGS. 3A and 3B show a simplified working principle and the SiC MOSFET gate voltage waveform with the GCC. In the GCC, the GaN HEMT is always in OFF state until negative voltage spikes reversely turn it on. Thus, the GCC is operated as a diode with high voltage drop connected between the gate and source of SiC MOSFET, as shown in FIG. 3A. And the clamped SiC MOSFET gate voltage waveform is shown in FIG. 3B.

Figure 4A:
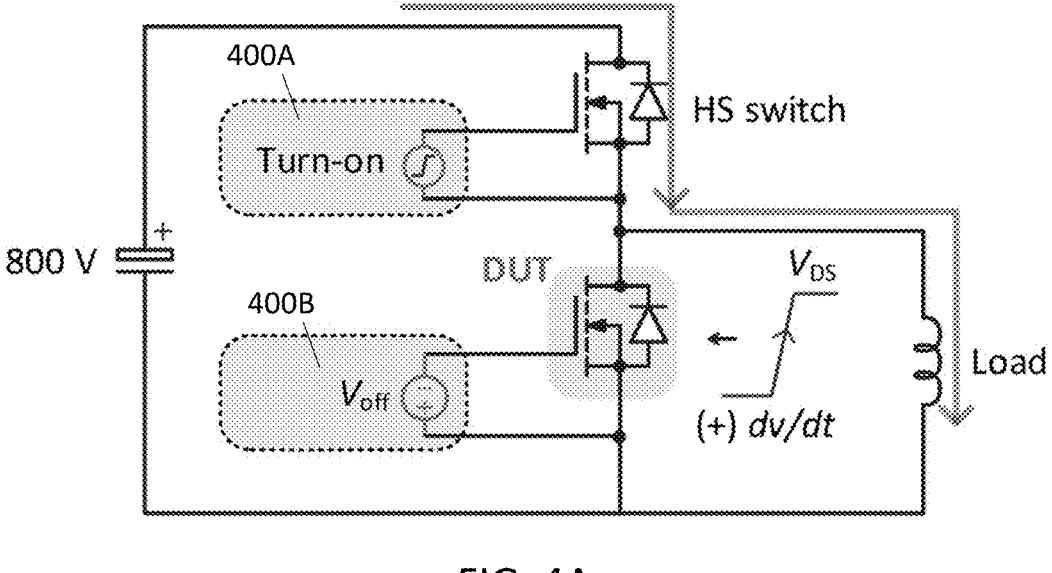
FIGS. 4A and 4B show the 800-V half-bridge double pulse test (DPT) set-up used to test the performance of GCC.
Figure 4B:
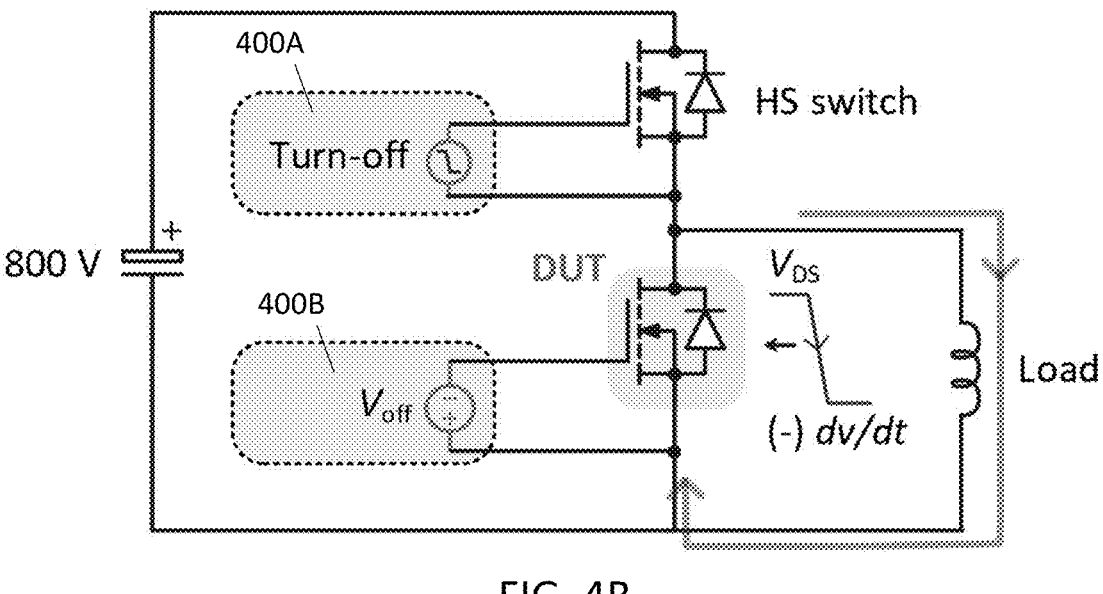

FIGS. 4A and 4B show the 800-V half-bridge double pulse test (DPT) set-up used to test the performance of GCC. Two identical SiC MOSFETs with identical driver circuits 400A and 400B are applied into the set-up shown in FIGS. 4A and 4B. The signals of the low-side device under test (DUT) are monitored. Flux cancellation and wide traces are applied in the testing circuit to minimize the gate loop parasitic inductance. A gate resistor of 4.3 $\Omega$60 is used for both turn-on and turn-off processes. In the DPT set-up, the DUT is always in OFF state. As shown in FIG. 4A, when the high-side (HS) switch is turned-on, the DUT's $V_{DS}$ will rise to 800 V with a positive dv/dt that could trigger a false turn-on event. As shown in FIG. 4B, when the HS switch is turned-off, the DUT's $V_{DS}$ will fall to zero with a negative dv/dt, hence the negative gate voltage spike event can be tested.

Figure 5A:
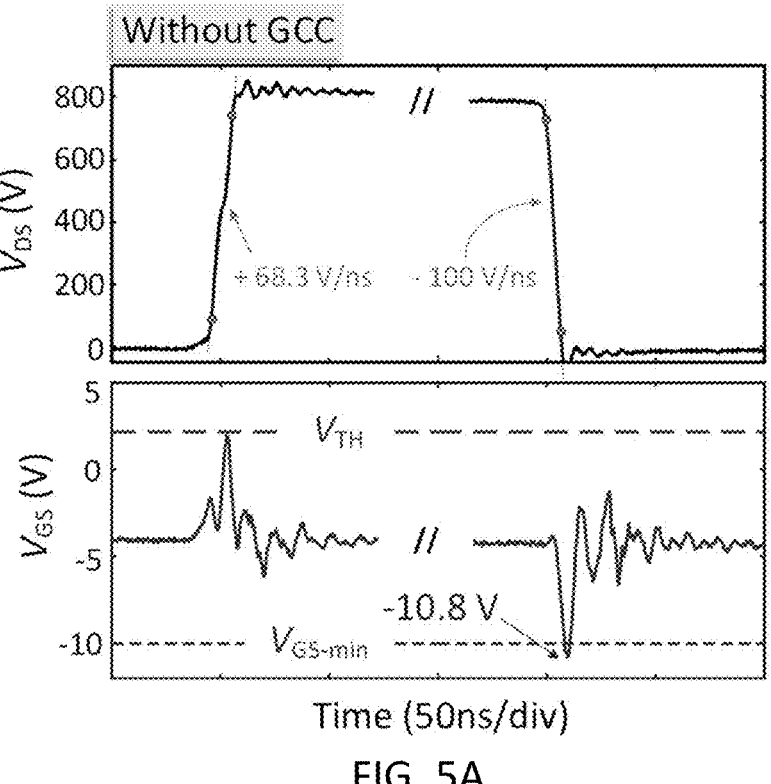
FIGS. 5A and 5B show the DUT's $V_{DS}$ and Vos waveforms during one switching cycle with a $V_{off}=-4$ V with and without the GCC, respectively.
Figure 5B:
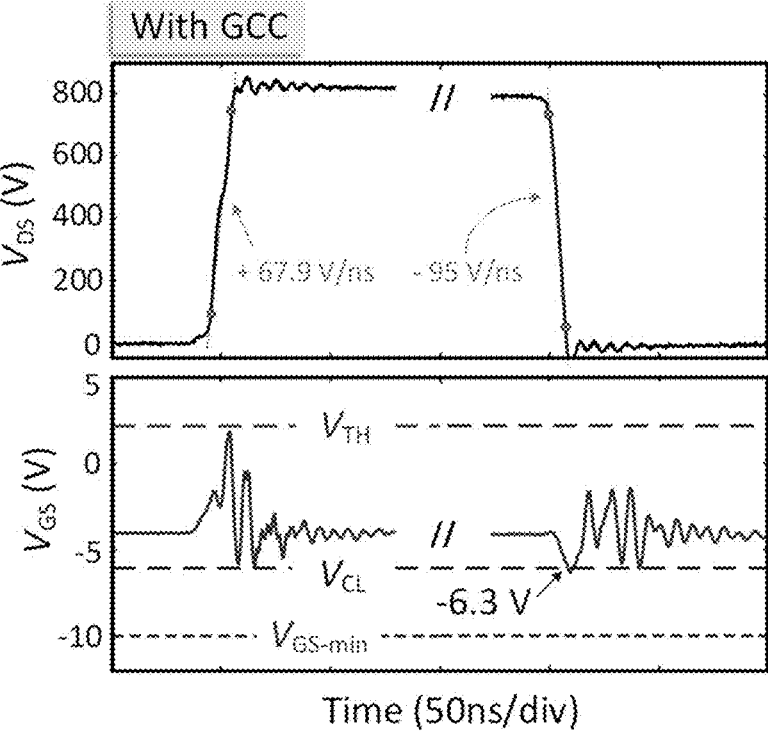

FIGS. 5A and 5B show the DUT's $V_{DS}$ and $V_{DS}$ waveforms during one switching cycle with a $V_{off}$=−4 V with and without the GCC, respectively. As shown in FIG. 5A, without the GCC, the negative spike exceeds the minimum transient gate voltage $V_{GS-min}$ (−10 V) although gate loop parasitic inductance is minimized ($V_{GS-min}$ of most commercial SiC MOSFETs are between −4 V and −10 V). As shown in FIG. 5B, with the GCC, the negative spike is successfully clamped. Considering the positive peak is still close to the SiC MOSFET's threshold voltage $V_{TH}$, a more negative $V_{off}$ is necessary to fully avoid false turn-on.

Figure 6A:
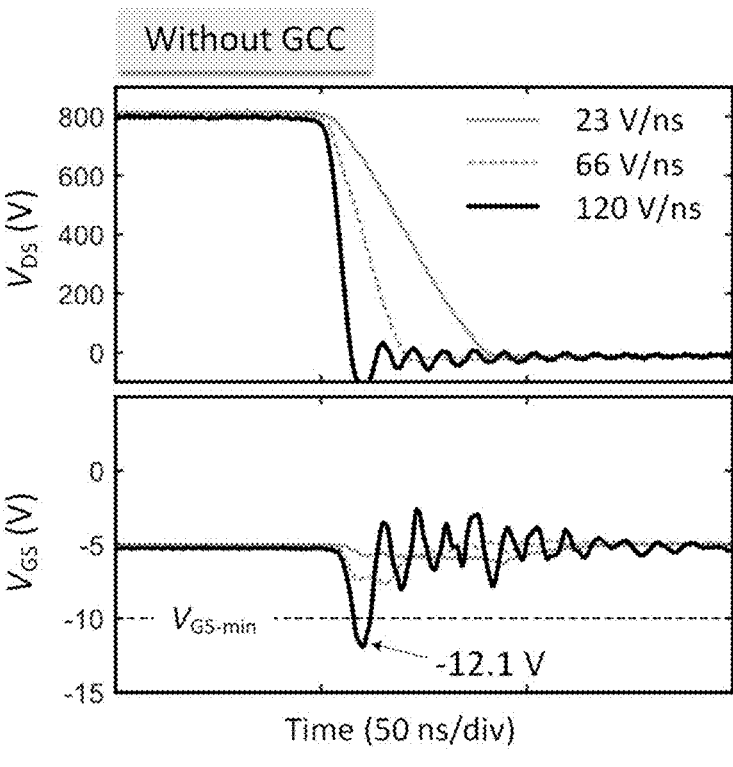
FIGS. 6A and 6B show the DUT's $V_{DS}$ and Vos waveforms under a negative OFF-state gate voltage ($V_{off}$) of −5 V at different slew rates with and without the GCC, respectively.
Figure 6B:
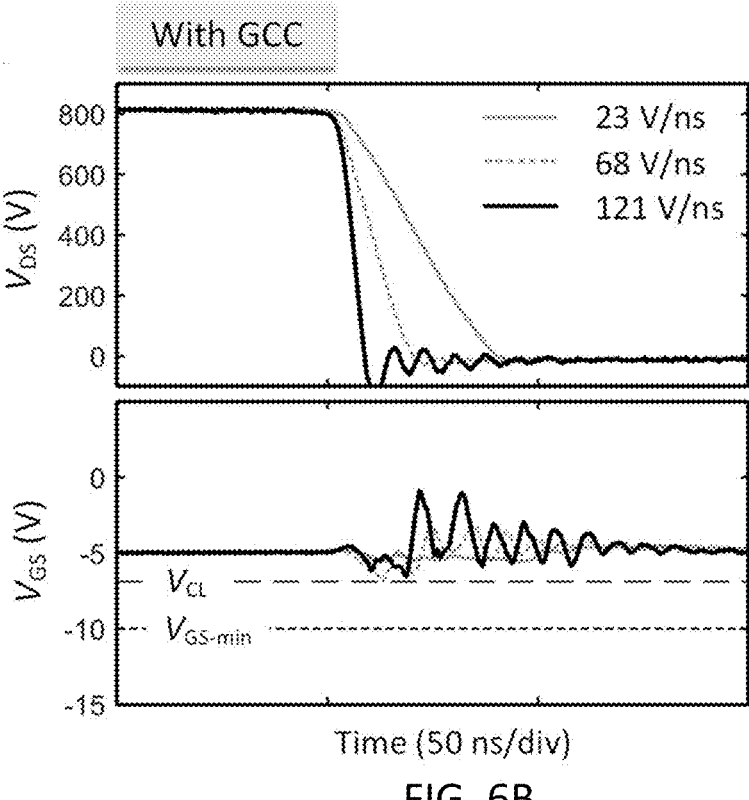
Figure 7:
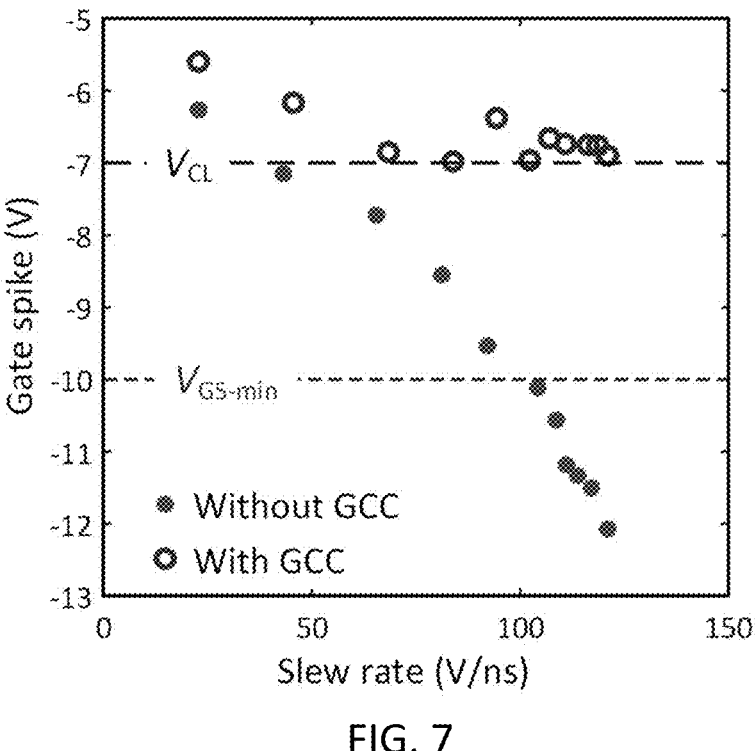
FIG. 7 shows negative gate spike amplitude with and without GCC at different slew rate with a negative OFF-state gate voltage ($V_{off}$) of −5 V.

FIGS. 6A and 6B show the DUT's $V_{DS}$ and $V_{DS}$ waveforms under a $V_{off}$ of −5 V at different slew rates with and without the GCC, respectively. FIG. 7 shows negative gate spike amplitude with and without GCC at different slew rate with $V_{off}$=−5 V. The $V_{off}$ of −5 V is selected because it is the minimum static gate voltage of most commercial SiC MOS-FETs. It can be seen that the GCC has superior clamping performance under different slew rates.

Figure 8:
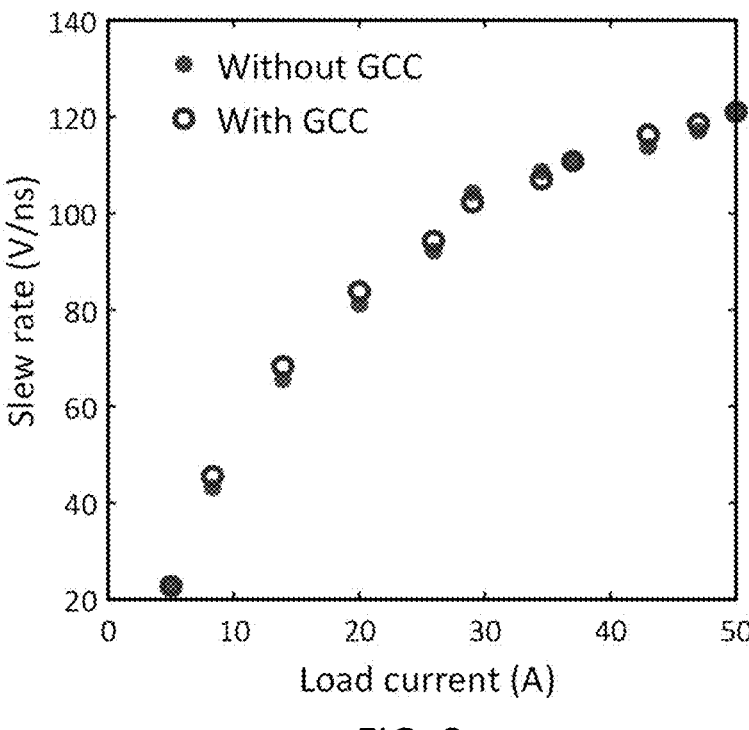
FIG. 8 shows the DUT slew rates against different load current under a negative OFF-state gate voltage ($V_{off}$) of −5 V with and without GCC.

FIG. 8 shows the DUT slew rates against different load current under a $V_{off}$ of −5 V with and without GCC. The overlapping results indicates that the switching speed of the SiC MOSFET is not affected by the GCC, thanks to the low output capacitance of the lateral GaN HEMT.

While the present disclosure has been described and illustrated with reference to specific embodiments thereof, these descriptions and illustrations are not limiting. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. Modifications may be made to adapt a particular situation, material, composition of matter, method, or process to the objective and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A gate clamping circuit for driving a wide bandgap device, comprising:
   a semiconductor switching device having a high side terminal connected to a gate of the wide bandgap device; and a low side terminal connected to a source of the wide bandgap device;
   a clamping resistor having a first end connected to a negative power supply terminal of a driver chip; and a second end connected to a control terminal of the semiconductor switching device; and
   a clamping capacitor having a first end connected to the second end of the clamping resistor; and a second end connected to the low side terminal of the semiconductor switching device;
   wherein the gate clamping circuit is configured to clamp negative voltage spike generated at the gate of the wide bandgap device when a negative off-state gate voltage is applied to suppress voltage overstress of the gate of the wide bandgap device; and
   the semiconductor switching device is a high-electron-mobility-transistor (HEMT) having a drain being the high side terminal of the semiconductor switching device; a source being the low side terminal of the semiconductor switching device; and a gate being the control terminal of the semiconductor switching device.

2. The gate clamping circuit according to claim 1, wherein the HEMT is a gallium nitride (GaN) HEMT.

3. The gate clamping circuit according to claim 2, wherein the GaN HEMT is enhancement-mode (E-mode) GaN HEMT.

4. The gate clamping circuit according to claim 3, wherein the E-mode GaN HEMT has a rated voltage higher than an on-state gate voltage of the wide bandgap device.

5. The gate clamping circuit according to claim 3, wherein the E-mode GaN HEMT has a rated current higher than a current flowing through the gate driver circuit.

6. The gate clamping circuit according to claim 1, wherein the clamping resistor has a resistance value in a range of 1$\Omega$-10000 $\Omega$.

7. The gate clamping circuit according to claim 1, wherein the clamping capacitor has a capacitance value equal to or higher than 0.1 nF.

8. A gate clamping driver circuit for driving a wide bandgap device, comprising:
   a driver chip having at least a driving terminal, a negative power supply terminal, a positive power supply terminal, and a ground reference terminal;
   a driving resistor having a first end connected to the driving terminal of the driver chip, and a second end connected to a gate of the wide bandgap device; and
   the gate clamping circuit of claim 1.

9. The gate clamping driver circuit according to claim 8, wherein the HEMT is a gallium nitride (GaN) HEMT.

10. The gate clamping driver circuit according to claim 9, wherein the GaN HEMT is enhancement-mode (E-mode) GaN HEMT.

11. The gate clamping driver circuit according to claim 10, wherein the E-mode GaN HEMT has a rated voltage higher than 20 V.

12. The gate clamping driver circuit according to claim 10, wherein the E-mode GaN HEMT has a rated current higher than 0.1 A.

13. The gate clamping driver circuit according to claim 8, wherein the clamping resistor has a resistance value in a range of 1$\Omega$-10000 $\Omega$.

14. The gate clamping driver circuit according to claim 8, wherein the clamping capacitor has a capacitance value higher than 0.1 nF.

\* \* \* \* \*